(12) United States Patent
Lu et al.

(10) Patent No.: US 8,362,352 B2
(45) Date of Patent: Jan. 29, 2013

(54) SOLAR CELL APPARATUS

(75) Inventors: Zhong-Liang Lu, Shenzhen (CN);
Shih-Hsun Wung, Taipei Hsien (TW)

(73) Assignees: Fu Zhun Precision Industry (Shen Zhen) Co., Ltd., Shenzhen (CN);
Foxconn Technology Co., Ltd., New Taipei (TW)

( * ) Notice: Subject to any disclaimer, the term of this patent is extended or adjusted under 35 U.S.C. 154(b) by 284 days.

(21) Appl. No.: 12/850,618

(22) Filed: Aug. 4, 2010

(65) Prior Publication Data
US 2012/0000507 A1 Jan. 5, 2012

(30) Foreign Application Priority Data
Jun. 30, 2010 (CN) .......................... 2010 1 0213991

(51) Int. Cl.
*H02N 6/00* (2006.01)
*H01L 31/042* (2006.01)
(52) U.S. Cl. ...................................... 136/246
(58) Field of Classification Search ................ 126/246; 136/246, 259
See application file for complete search history.

(56) References Cited

U.S. PATENT DOCUMENTS

| | | | |
|---|---|---|---|
| 4,297,003 A * | 10/1981 | Hutchison | 359/852 |
| 2006/0196640 A1* | 9/2006 | Siu | 165/104.26 |
| 2006/0231133 A1* | 10/2006 | Fork et al. | 136/246 |
| 2007/0144705 A1* | 6/2007 | Chen et al. | 165/80.3 |
| 2007/0215198 A1* | 9/2007 | Jiang et al. | 136/246 |
| 2008/0023061 A1* | 1/2008 | Clemens et al. | 136/246 |
| 2008/0295993 A1* | 12/2008 | Chen et al. | 165/80.3 |

* cited by examiner

*Primary Examiner* — Keith Hendricks
*Assistant Examiner* — Eli Mekhlin
(74) *Attorney, Agent, or Firm* — Altis Law Group, Inc.

(57) ABSTRACT

A solar cell apparatus includes a heat dissipating device and a solar cell panel. The heat dissipating device includes a heat sink, a supporting member disposed on the heat sink, a heat absorbing member disposed on the supporting member, and a heat pipe thermally contacting with the heat absorbing member and the heat sink. The solar cell panel is attached on the heat absorbing member.

15 Claims, 4 Drawing Sheets

SOLAR CELL APPARATUS

BACKGROUND

1. Technical Field

The disclosure relates to solar cell apparatuses and, particularly, to a solar cell apparatus having a good heat dissipation performance.

2. Description of Related Art

The solar cell apparatus is well known as a cost-effective power supply device, which converts light power to electrical power. Nowadays, the solar cell apparatuses are widely used in various areas. Generally, the solar cell apparatus comprises at least a solar cell panel and a light-reflecting board to focus solar towards the solar cell panel.

However, the solar cell panel usually requires a large quantity of sunlight focused thereon for producing adequate electricity power, which results in a rapid rise in operating temperature of the solar cell panel. A high temperature may damage the solar cell panel.

What is needed, therefore, is a solar cell apparatus which can overcome the described limitations.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
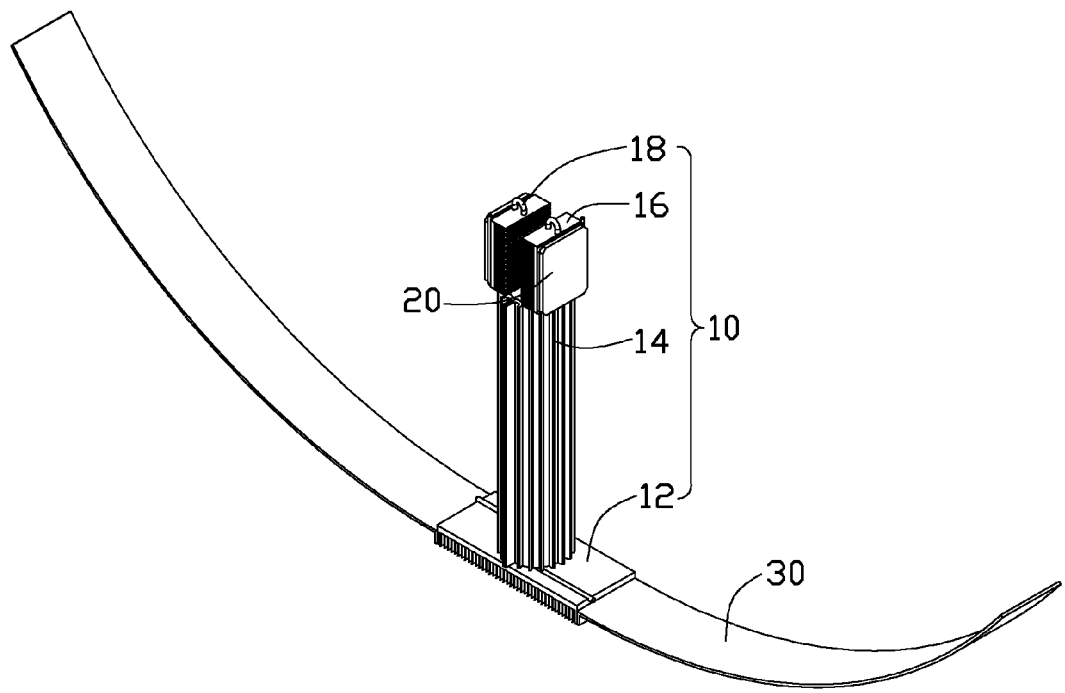
FIG. 1 is an isometric, assembled view of a solar cell apparatus in accordance with an embodiment of the disclosure.
Figure 2:
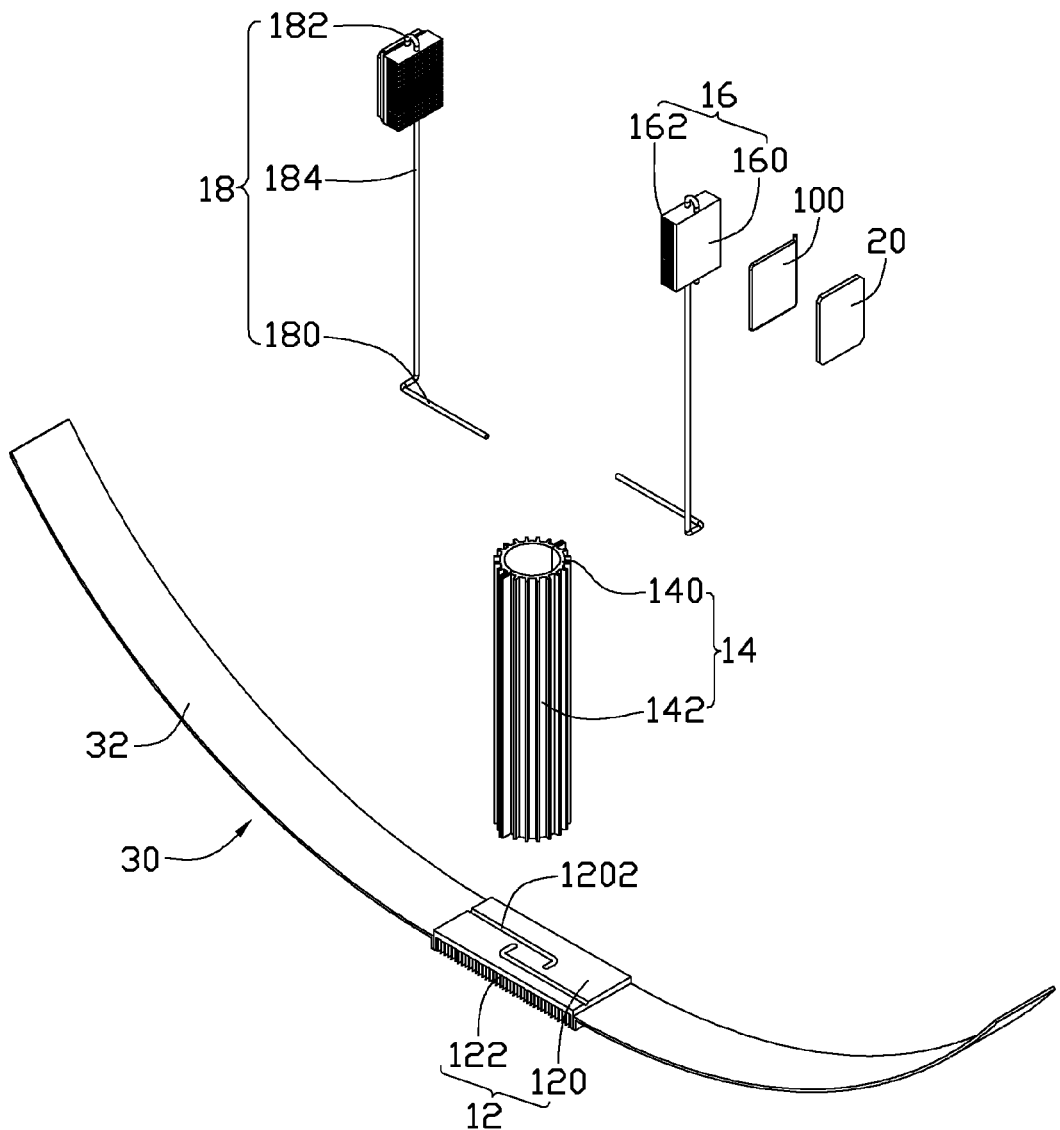
FIG. 2 is an exploded view of the solar cell apparatus of FIG. 1.
Figure 3:
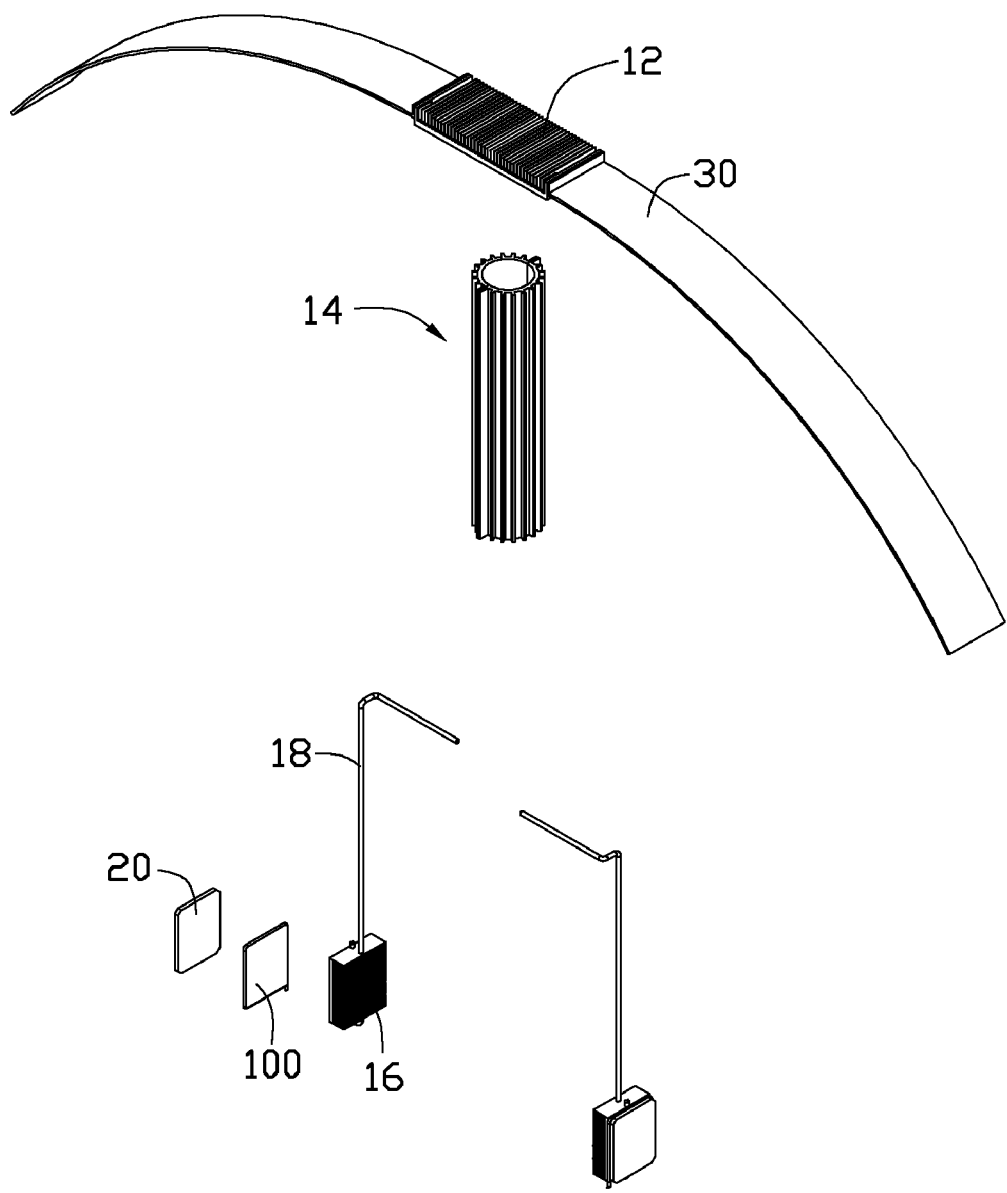
FIG. 3 is an inverted, exploded view of the solar cell apparatus of FIG. 1.

Referring to FIGS. 1-3, a solar cell apparatus in accordance with an embodiment of the disclosure has a good heat dissipation performance. The solar cell apparatus comprises a heat dissipating device 10, two solar cell panels 20 mounted on the heat dissipating device 10, and two light reflecting boards mounted on the heat dissipating device 10 and correspondingly facing the two solar cell panels 20.

Figure 4:
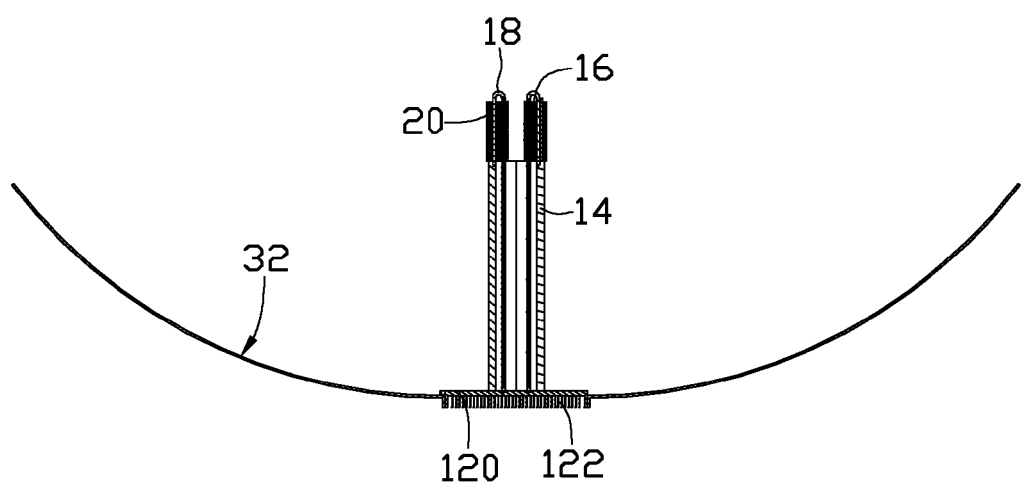
FIG. 4 shows a cross sectional view of the solar cell apparatus of FIG. 1.

Referring to FIG. 4 also, the heat dissipating device 10 comprises a heat sink 12, a supporting member 14 disposed on the heat sink 12, two heat absorbing members 16 disposed on the supporting member 14, and two heat pipes 18 thermally contacting with the two heat absorbing members 16 and the heat sink 12, respectively.

The heat sink 12 is integrally made of a metal with good heat conductivity such as aluminum, copper or an alloy thereof. The heat sink 12 comprises a rectangular base 120 and a plurality of fins 122 extending downwardly from a bottom face of the base 120. The fins 122 are spaced from and parallel to each other. Two spaced receiving grooves 1202 are defined in a top face of the base 120, for correspondingly receiving the two heat pipes 18 therein.

The supporting member 14 is integrally made of a metal with good heat conductivity such as aluminum, copper or an alloy thereof. The supporting member 14 comprises an elongated cylinder 140 with a through hole (not labeled) defined therein and a plurality of elongated ribs 142 evenly extending outwardly from a circumferential face of the cylinder 140. The ribs 142 are spaced from each other and arranged radially relative to an axis of the cylinder 140. The cylinder 140 is perpendicularly disposed on the top face of the base 120 of the heat sink 12.

Each of the heat absorbing members 16 is integrally made of a metal with good heat conductivity such as aluminum, copper or an alloy thereof. The heat absorbing member 16 comprises a rectangular board 160 and a plurality of heat conducting fins 162 extending inwardly from a face of the board 160 towards the other heat absorbing member 16. The heat conducting fins 162 are spaced from and parallel to each other. The two heat absorbing members 16 are perpendicularly disposed on a top end of the supporting member 14 and opposite to each other. The heat conducting fins 162 of the two heat absorbing members 16 face to each other, and an another face of the board 160 of each heat absorbing member 16 opposite to the heat conducting fins 162 thereof faces outwardly. The two solar cell panels 20 are correspondingly attached on the outward faces of the boards 160. The heat dissipating device 10 further comprises two flat vapor chambers 100 correspondingly sandwiched between the two solar cell panels 20 and the boards 160, for improving heat absorbing performance of the heat absorbing members 16.

Each of the heat pipes 18 comprises a heat absorbing section 182, a heat dissipating section 180 and a straight connecting section 184 interconnecting the heat absorbing section 182 and the heat dissipating section 180. The heat absorbing section 182 is U-shaped, and extends perpendicularly through the heat conducting fins 162 and thermally contacts the board 160 of a corresponding heat absorbing member 16. The connecting section 184 extends through the through hole of the cylinder 140. The heat dissipating section 180 is L-shaped and correspondingly accommodated in one receiving groove 1202 of the base 120. The heat dissipating section 180 has a dimension corresponding to that of the receiving groove 1202.

The light reflecting board 30 is integrally formed of a transparent or semitransparent material such as resin, polymethyl methacrylate (PMMA) or plastic. In the embodiment of this disclosure, two light reflecting boards 30 extend outwardly from two opposite lateral sides of the base 120 of the heat sink 12, respectively. Top faces 32 of the two light reflecting boards 30 directly face the two solar cell panels 20, respectively. Each of the light reflecting boards 30 is curved. A light reflecting film/coating is (not labeled) further provided to spread on the top face 32 of each light reflecting board 30, for improving light reflecting performance of the light reflecting board 30. A part of heat on the solar cell panels 20 is dissipated by the heat absorbing members 16, and another part of heat on the cell panels 20 is dissipated by the heat sink 12 via the heat pipes 18.

It is to be understood, however, that even though numerous characteristics and advantages of the present embodiments have been set forth in the foregoing description, together with details of the apparatus and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A solar cell apparatus comprising:
   a solar cell panel;

a heat dissipating device comprising a heat sink, a supporting member disposed on the heat sink, a heat absorbing member disposed on the supporting member, and a heat pipe thermally contacting with the heat absorbing member and the heat sink; and two light reflecting extending outwardly from two opposite lateral sides of the heat sink;

wherein the solar cell panel is attached on the heat absorbing member, wherein the heat sink comprises a base and a plurality of fins extending from a bottom face of the base;

wherein the heat pipe comprises a heat absorbing section contacting with the heat absorbing member, a heat dissipating section contacting with the base of the heat sink, and a connecting section interconnecting the heat absorbing section and the heat dissipating section;

wherein the heat absorbing member comprises a board and a plurality of heat conducting fins extending inwardly from a face of the board;

wherein the solar cell panel is attached on an opposite face of the board of the heat absorbing member;

further comprising an additional heat absorbing member and an additional solar cell panel, wherein the additional heat absorbing member comprises a board and a plurality of heat conducting fins extending inwardly from a face of the board of the additional heat absorbing member, the heat conducting fins of the heat absorbing member facing the heat conducting fins of the additional heat absorbing member, the boards of the heat absorbing member and the additional heat absorbing member face outwardly, the additional solar cell panel being attached to the board of the additional heat absorbing member.

2. The solar cell apparatus as claimed in claim 1, wherein a receiving groove is defined in a top face of the base, and the heat dissipating section is accommodated in the receiving groove.

3. The solar cell apparatus as claimed in claim 1 further comprises a flat vapor chamber sandwiched between the solar cell panel and the board of the heat absorbing member.

4. The solar cell apparatus as claimed in claim 1, wherein the heat absorbing section of the heat pipe extends through the heat conducting fins.

5. The solar cell apparatus as claim in claim 1, wherein the supporting member comprises a cylinder with a through hole defined therein and a plurality of elongated ribs extending outwardly from a circumferential face of the cylinder.

6. The solar cell apparatus as claimed in claim 5, wherein the ribs are spaced from each other and arranged radially relative to an axis of the cylinder.

7. The solar cell apparatus as claimed in claim 5, wherein the connecting section of the heat pipe extends through the through hole of the cylinder.

8. The solar cell apparatus as claimed in claim 1, wherein top faces of the light reflecting boards face the solar cell panel.

9. The solar cell apparatus as claimed in claim 8, wherein each of the light reflecting boards has a curved shape.

10. The solar cell apparatus as claimed in claim 9, wherein the heat sink is sandwiched between the two light reflecting boards.

11. The solar cell apparatus as claimed in claim 8, wherein each of the light reflecting boards is integrally formed of a transparent or semitransparent material selected from resin, polymethyl methacrylate and plastic.

12. The solar cell apparatus as claimed in claim 11, wherein the top face of each of the light reflecting boards is provided with one of a light reflecting film and a light reflecting coating.

13. The solar cell apparatus as claimed in claim 1, wherein the heat dissipating section of the heat pipe is L-shaped and accommodated in one receiving groove of the base of the heat sink.

14. The solar cell apparatus as claimed in claim 13, wherein the heat dissipating section of the heat pipe defines a plane, the connecting section of the heat pipe is located outside the plane.

15. The solar cell apparatus as claimed in claim 1, further comprising an additional heat pipe, wherein the additional heat pipe thermally contacts the additional heat absorbing member and the heat sink, the heat absorbing member and the additional heat absorbing member spacing from each other and resting on the supporting member.

* * * * *